(12) United States Patent
Kamiyama et al.

(10) Patent No.: US 9,257,948 B2
(45) Date of Patent: Feb. 9, 2016

(54) HIGH EFFICIENCY POWER AMPLIFIER (75) Inventors: Masahiro Kamiyama, Tokyo (JP); Ryo Ishikawa, Tokyo (JP); Kazuhiko Honjo, Tokyo (JP)

(73) Assignee: The University of Electro-Communications, Tokyo (JP)

( * ) Notice: Subject to any disclaimer, the term of this patent is extended or adjusted under 35 U.S.C. 154(b) by 0 days.

(21) Appl. No.: 14/241,503

(22) PCT Filed: Aug. 29, 2012

(86) PCT No.: PCT/JP2012/071909
§ 371 (c)(1),
(2), (4) Date: Feb. 27, 2014

(87) PCT Pub. No.: WO2013/031865
PCT Pub. Date: Mar. 7, 2013

(65) Prior Publication Data
US 2014/0225671 A1 Aug. 14, 2014

(30) Foreign Application Priority Data
Aug. 29, 2011 (JP) .................................. 2011-186626

(51) Int. Cl.
*H03F 3/191* (2006.01)
*H03F 3/21* (2006.01)
(Continued)

(52) U.S. Cl.
CPC ................ *H03F 3/21* (2013.01); *H03F 1/0205* (2013.01); *H03F 1/56* (2013.01); *H03F 3/193* (2013.01);
(Continued)

(58) Field of Classification Search
CPC ............... H03F 3/60; H03F 1/02; H03F 3/20; H03F 3/21; H03F 2200/255; H03F 2200/387; H03F 2200/423; H01P 1/212

USPC ............ 330/302, 53, 286, 296, 261; 333/176, 333/33, 263

See application file for complete search history.

(56) References Cited

U.S. PATENT DOCUMENTS

| | | | |
|---|---|---|---|
| 5,473,281 A | 12/1995 | Honjo | |
| 6,396,348 B1 * | 5/2002 | Honjo | ........................... 330/286 |

(Continued)

FOREIGN PATENT DOCUMENTS

| | | |
|---|---|---|
| CN | 102035058 A | 4/2011 |
| CN | 102138281 A | 7/2011 |

(Continued)

OTHER PUBLICATIONS

Kuroda et. al., "Parasitic Compensation Design Technique for a C-Band GaN HEMT Class-F Amplifier", IEEE Transactions on Microwave Theory and Techniques, vol. 58, Issue: 11, Part: 1, pp. 2741-2750. (provided as part of IDS).*

(Continued)

*Primary Examiner* — Steven J Mottola
*Assistant Examiner* — Hafizur Rahman
(74) *Attorney, Agent, or Firm* — Sughrue Mion, PLLC (57) ABSTRACT

A high efficiency power amplifier of the present invention includes a transistor and an output power processing circuit section. The output power processing circuit section includes an output matching circuit section and an output harmonic processing circuit section. The output matching circuit section carries out impedance matching to the fundamental wave component of the output power. The output harmonic processing circuit section carries out a reactive power control to a reactive power of a plurality of harmonic power components respectively having a plurality of harmonic angular frequencies which are integral multiples of the base angular frequency of the output power. The output harmonic processing circuit section is formed to realize the reactive power control to at least one of the plurality of harmonic power components by orthogonalizing the phases of the current and voltage in the reactive power.

13 Claims, 6 Drawing Sheets

(51) Int. Cl.
H03F 1/56 (2006.01)
H03F 3/24 (2006.01)
H03F 3/217 (2006.01)
H03F 3/60 (2006.01)
H03F 1/02 (2006.01)
H03F 3/193 (2006.01)

(52) U.S. Cl.
CPC .............. *H03F 3/2171* (2013.01); *H03F 3/245* (2013.01); *H03F 3/601* (2013.01); *H03F 2200/108* (2013.01); *H03F 2200/222* (2013.01); *H03F 2200/255* (2013.01); *H03F 2200/306* (2013.01); *H03F 2200/309* (2013.01); *H03F 2200/315* (2013.01); *H03F 2200/387* (2013.01); *H03F 2200/391* (2013.01); *H03F 2200/399* (2013.01); *H03F 2200/402* (2013.01); *H03F 2200/423* (2013.01); *H03F 2200/451* (2013.01)

(56) References Cited

U.S. PATENT DOCUMENTS

| | | |
|---|---|---|
| 2011/0050350 A1 | 3/2011 | Honjo et al. |
| 2011/0081873 A1 | 4/2011 | Akasegawa |
| 2011/0163814 A1 | 7/2011 | Hellberg |

FOREIGN PATENT DOCUMENTS

| | | |
|---|---|---|
| EP | 1091442 A2 | 4/2001 |
| EP | 1344315 B1 | 3/2008 |
| JP | 07-094974 A | 4/1995 |
| JP | 2001-111362 A | 4/2001 |
| JP | 2009-081605 A | 4/2009 |
| JP | 4335633 B2 | 9/2009 |
| JP | 2011-055152 A | 3/2011 |
| JP | 2011-066839 A | 3/2011 |

OTHER PUBLICATIONS

International Preliminary Report on Patentability issued Mar. 4, 2014 in PCT/JP2012/071909.

Paolo Colantonio et al., "A C-Band High-Efficiency Second-Harmonic-Tuned Hybrid Power Amplifier in GaN Technology," IEEE Transactions on Microwave Theory and Techniques, Jun. 2006, pp. 2713-2722, vol. 54, No. 6.

Yue Hao et al., "High-Performance Microwave Gate-Recessed AlGaN/AlN/GaN MOS-HEMT With 73% Power-Added Efficiency," IEEE Electron Device Letters, May 2011, pp. 626-628, vol. 32, No. 5.

Renato Negra et al., "BiCMOS MMIC class-E power amplifier for 5 to 6 GHz wireless communication systems," in Proc. 35th Eur. Microw. Conf., Paris, France, Oct. 2005, pp. 445-448.

Yoshinori Tsuyama et al., "Internally-matched GaN HEMT High Efficiency Power Amplifier for SPS," IEEE MTT-S Int. Microw. Works. Dig., Kyoto, Japan, May 2011, pp. 41-44.

Kenta Kuroda et al., "Parasitic Compensation Design Technique for a C-Band GaN HEMT Class-F Amplifier," IEEE Transactions on Microwave Theory and Techniques, Nov. 2010, pp. 2741-2750, vol. 58, No. 11.

International Search Report of PCT/JP2012/071909 dated Dec. 4, 2012.

Communication dated Jun. 8, 2015 from the European Patent Office in counterpart application No. 12827288.7.

Grebennikov, "High-Efficiency Class-FE Tuned Power Amplifiers", IEEE Transactions on Circuits and Systems—I: Regular Papers, vol. 55, No. 10, Nov. 1, 2008, pp. 3284-3292.

Communication dated Sep. 30, 2015 from the State Intellectual Property Office of the People's Republic of China in counterpart application No. 201280041707.6.

* cited by examiner

HIGH EFFICIENCY POWER AMPLIFIER

CROSS REFERENCE TO RELATED APPLICATIONS

This is a National Stage of International Application No. PCT/JP2012/071909 filed Aug. 29, 2012, claiming priority based on Japanese Patent Application No. 2011-186626 filed Aug. 29, 2011, the contents of all of which are incorporated herein by reference in their entirety.

TECHNICAL FIELD

The present invention is related to a power amplifier and, especially, to a power amplifier in which power efficiency is improved by restraining average power consumption of the harmonics in the power amplifier.

BACKGROUND ART

In power amplification, the improvement of the power efficiency is important. When amplifying the power containing a desired fundamental wave with the power amplifier using a transistor, unnecessary power components of the harmonics of frequencies of integral multiples of the fundamental wave frequency are generated in addition to a fundamental wave power component having the fundamental wave frequency because the transistor is a non-linear device. When these unnecessary harmonic power components are consumed in the power amplifier, the power added efficiency of the power amplifier reduces.

As a method of preventing the power added efficiency from reducing by controlling the harmonic power components, a method of using the class-F amplification and the inverse class-F amplification is known. In the time-domain of the class-F amplification and the inverse class-F amplification, voltage and current are separated on the output side of the transistor. More specifically, in the class-F amplification, the voltage is a square wave, the current is a half sine wave, and the voltage and the current turn to a zero level alternately. On the contrary, in the inverse class-F amplification, the current is a square wave, the voltage is a half sine wave, and the voltage and the current turn to the zero level alternately.

Figure 1A:
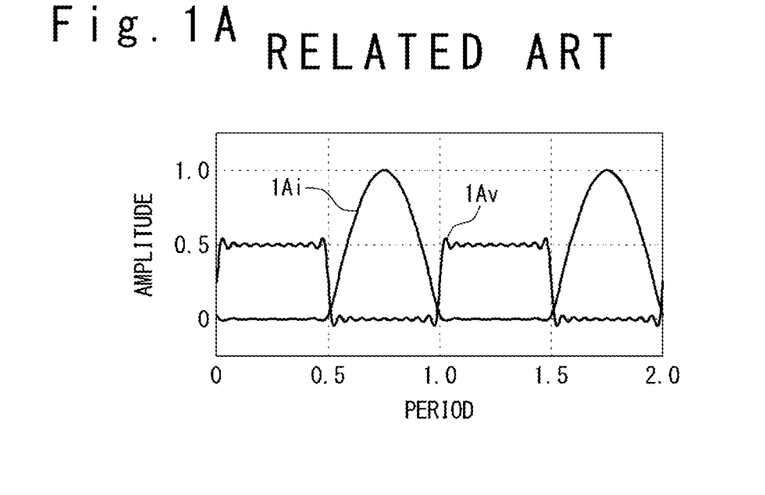
FIG. 1A is a graph group showing an example of a time change of current flowing into a transistor of a class-F amplifier and voltage generated at an output terminal of the transistor.

FIG. 1A is a graph group showing an example of a time change of the current flowing into the transistor and the voltage generated at the output terminal of the transistor in the class-F amplifier. Here, the current flowing into the transistor is, for example, a drain current, and the voltage generated at the output terminal of the transistor is, for example, a voltage between the drain and the source. The graph group of FIG. 1A contains a first graph 1Ai showing the current flowing into the transistor and a second graph 1Av showing the voltage generated at the output terminal of the transistor. In FIG. 1A, the horizontal axis shows the time in unit of period of the fundamental wave and the vertical axis shows amplitudes of current and voltage. The current $i_d(t)$ in the first graph 1Ai and the voltage $v_{ds}(t)$ in the second graph 1Av are shown by the following equation (1).

$$i_d(t) = \frac{1}{\pi} - \frac{1}{2}\sin\omega_0 t - \frac{2}{\pi}\sum_{m=1}^{5}\frac{1}{4m^2-1}\cos 2m\omega_0 t \quad (1)$$

$$v_{ds}(t) = \frac{1}{2}\left[\frac{1}{2} + \frac{2}{\pi}\sin\omega_0 t + \frac{2}{\pi}\sum_{m=1}^{9}\frac{1}{2m+1}\sin(2m+1)\omega_0 t\right]$$

As shown in the example of FIG. 1A, in the transistor of the class-F amplifier, when the voltage between the drain and the source is generated, a drain current is turned to a zero level, and on the contrary, when the drain current is generated, the voltage between the drain and the source is turned to the zero level. Therefore, the power consumed in the transistor of the class-F amplifier is zero, and the average power consumption is also zero. As a result, in the class-F amplifier, the power efficiency of 100% is obtained theoretically. The characteristics are the same as in the inverse class-F amplifier.

In conjunction with the above, Patent Literature 1 (Japanese Patent No. 4,335,633) discloses the technique of a class-F amplification circuit and an addition circuit for the class-F amplifier. This class-F amplification circuit is composed of a transistor and a load circuit disposed at a rear stage of the transistor. The load circuit is composed of a first reactance two-terminal circuit and a second reactance two-terminal circuit. Impedance of each of the circuits has the zero in the even-order harmonic and a pole in the odd-order harmonic according to need.

Also, Patent Literature 2 (JP 2011-55152A) discloses the technique of an amplification circuit. The amplification circuit is composed of a transistor, a harmonic processing circuit disposed at the rear stage of the transistor, and a resonant circuit section disposed at the rear stage of the harmonic processing circuit. The transistor can be illustrated as an equivalent circuit which has a current source, a drain-source capacitance and a drain inductance. The harmonic processing circuit has a ladder-type circuit of n stages, each of which n stages contains a parallel capacitance and a serial inductor. Here, the n is an integer equal to or more than 1. The resonant circuit section has (2n+1) resonators whose resonance frequencies are different from each other. The resonance frequencies of the (2n+1) resonators frequency are coincident with the frequencies of the (n+1) zeros and n poles which are formed between the drain output section of the transistor and the ground when the output section of the harmonic processing circuit is short-circuited. The resonance frequencies of the 2n resonators of these (2n+1) resonators are respectively coincident with the frequencies of second to $(2n+1)^{th}$ harmonics.

Also, Patent Literature 3 (JP 2011-66839A) discloses a microwave harmonic processing circuit. The microwave harmonic processing circuit has a serial transmission line and a plurality of parallel open stubs connected to an output terminal of the serial transmission line in parallel with each other. The serial transmission line is connected with the output terminal of the transistor at the input terminal and has a predetermined electric length. The plurality of parallel open stubs have predetermined electric lengths to the second to $n^{th}$ harmonics. Here, the n is an optional integer and the total number of parallel open stubs is (n−1). The microwave harmonic processing circuit has a first transmission line layer, a second transmission line layer, a ground layer and vias. The first transmission line layer is configured from the serial transmission line and two of the (n−1) parallel open stubs which two are connected to one connection point. The second transmission line layer is configured from the (n−3) parallel open stubs excluding the above two parallel open stubs which are connected to a connection point. The ground layer is arranged between the first transmission line layer and the second transmission line layer. The via connects the connection point in the first transmission line layer and the connection point in the second transmission line layer electrically.

CITATION LIST

[Patent Literature 1] Japanese Patent No. 4,335,633
[Patent Literature 2] JP 2011-55152A
[Patent Literature 3] JP 2011-66839A
[Non-Patent Literature 1] P. Colantonio, F. Gianni, R. Giofre, E. Limiti, A. Serino, M. Peroni, P. Romanini, and C. Proietti, "A C-band high efficiency second-harmonic-tuned hybrid power amplifier in GaN technology", IEEE Trans. Microw. Theory Tech., vol. 54, No. 6, pp. 2713-2722, June 2006
[Non-patent literature 2] Y. Hao, L. Yang, X. Ma, J. Ma, M. Cao, C. Pan, C. Wang, and J. Zhang, "High-Performance Microwave Gate-Recessed AlGaN/AlN/GaN MOS-HEMT With 73% Power-Added Efficiency", IEEE Electron Device Lett., vol. 32, No. 5, pp. 626-628, May 2011
[Non-patent Literature 3] R. Negra, and W. Bachtold, "BiCMOS MMIC class-E power amplifier for 5 to 6 GHz wireless communication systems", in Proc. 35th Eur. Microw. Conf., Paris, France, October 2005, pp. 445-448
[Non-patent Literature 4] Y. Tsuyama, K. Yamanaka, K. Namura, S. Chaki, and N. Shinohara, "Internally-matched GaN HEMT high efficiency power amplifier for SPS", IEEE MTT-S Int. Microw. Works. Dig., Kyoto, Japan, May 2011, pp. 41-44
[Non-patent Literature 5] K. Kuroda, R. Ishikawa, K. Honjo, "Parasitic compensation design technique for a C-band GaN HEMT class-F amplifier", IEEE Trans. Microw. Theory Tech., vol. 58, No. 11, pp. 2741-2750, November 2010.

SUMMARY OF THE INVENTION

In this way, the class-F amplifier and the inverse class-F amplifier realize very excellent power efficiency. However, in order to fully separate current and voltage in actual, the harmonic power component requires a large amplitude, namely, a transistor with the excellent high frequency characteristics is required. Also, because it is easy for the class-F amplifier and the inverse class-F amplifier to undergo the influence of circuit loss, there is a case that it is relatively difficult to realize an ideal state especially in the microwave band.

One object of the present invention is to provide a high efficiency power amplifier which can be relatively easily realized in a high frequency band containing a microwave band.

In the high efficiency power amplifier according to the present invention, the output power processing circuit section is provided at the rear stage of the transistor to carries out the reactive power control to the harmonic power components of the output power. The output power processing circuit section carries out the reactive power control to at least a part of the harmonic power components by orthogonalizing the phases of its current and voltage. Thus, the power amplifier of the high efficiency can be relatively easily realized in the high frequency band which contains a microwave band.

DESCRIPTION OF EMBODIMENTS

Hereinafter, a high efficiency power amplifier according to embodiments of the present invention will be described below with reference to the attached drawings.

Embodiment

As a technique to restrain power consumption in a transistor, a reactive power control, e.g. a technique to carry out a control to reactive power by orthogonalizing a phase of current and a phase of voltage in a harmonic is thought of, in addition to a technique to zero power consumption in a transistor by separating a current flowing into the transistor and a voltage generated at the output terminal of the transistor in a time-domain, like a class-F amplifier and an inverse class-F amplifier. In the high efficiency power amplifier according to the present invention, harmonic power consumption in the transistor can be restrained by using the technique to orthogonalize the phases of current and voltage of the harmonic, independently or together with the technique to use the class-F amplifier and the inverse class-F amplifier.

Figure 1B:
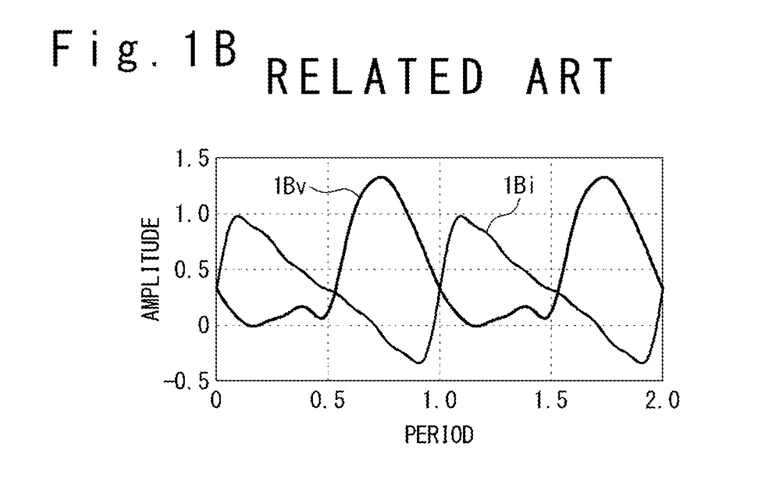
FIG. 1B is a graph group showing an example of a time change of current flowing into a transistor and voltage generated at an output terminal of the transistor, when phases are orthogonalized for every harmonic.

FIG. 1B is a graph group showing an example of the time change of the current flowing into the transistor and the voltage generated at the output terminal of the transistor, when the phases are orthogonalized for every harmonic. The graph group of FIG. 1B contains a first graph 1Bi showing the current flowing into the transistor and a second graph 1Bv showing the voltage generated at the output terminal of the transistor. In FIG. 1B, a horizontal axis shows the elapsed time in units of periods of a fundamental wave, and a vertical axis shows amplitudes of the current and voltage. The current $i_d(t)$ shown in the first graph 1Bi and the voltage $v_{ds}(t)$ shown in the second graph 1Bv are shown by the following equation (2).

$$i_d(t) = \frac{1}{\pi} + \frac{1}{2}\sin\omega_0 t + \sum_{m=1}^{5} \frac{1}{(m+1)^2}\sin(m+1)\omega_0 t \qquad (2)$$

-continued $$v_{ds}(t) = \frac{1}{2} - \frac{2}{\pi}\sin\omega_0 t + \frac{2}{\pi}\sum_{m=1}^{5}\frac{(-1)^m}{(m+1)^2-1}\cos(m+1)\omega_0 t$$

It should be noted that the above equation (2) shows a case that a phase difference "•" is zero in the following equation (3) in which is more realistic equation.

$$i_d(t) = \frac{1}{\pi} + \frac{1}{2}\sin\omega_0 t + \sum_{m=1}^{5}\frac{1}{(m+1)^2}\sin(m+1)\omega_0 t \qquad (3)$$

$$v_{ds}(t) =$$
$$\frac{1}{2} - \frac{2}{\pi}\sin(\omega_0 t + \Phi) + \frac{2}{\pi}\sum_{m=1}^{5}\frac{(-1)^m}{(m+1)^2-1}\cos(m+1)\omega_0 t$$

As shown in the example of FIG. 1B, there is no period for which the current and/or the voltage are maintained to zero, especially. However, the time integration of the power consumption in the transistor obtained by integrating a product of the current and voltage becomes zero, i.e. theoretically, the power amplifier of the power efficiency of 100% is obtained. Here, in the high efficiency power amplifier of the present invention, an extremely high power efficiency has been obtained in which the drain efficiency exceeds 90% in an actual measurement even if a phase difference between the current and the voltage in each of the harmonics except the desired fundamental wave is shifted slightly from ±90° as an ideal value.

Figure 2:
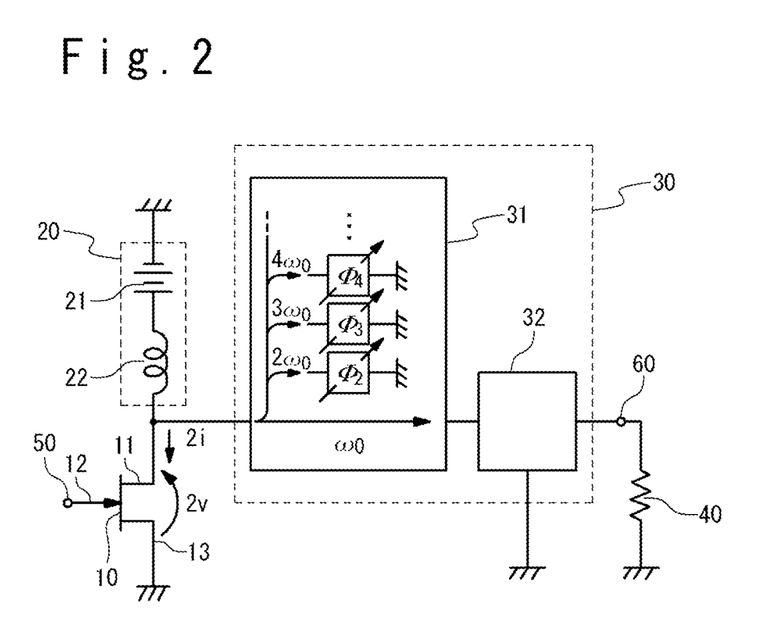
FIG. 2 is a circuit diagram showing a basic configuration of a high efficiency power amplifier according to an embodiment of the present invention.

FIG. 2 is a circuit diagram conceptually showing a basic configuration of the high efficiency power amplifier according to the present embodiment of the present invention. The components of the high efficiency power amplifier shown in FIG. 2 will be described. The high efficiency power amplifier shown in FIG. 2 is composed of a transistor 10, a power supply circuit section 20, an output power processing circuit section 30, an input section 50 and an output section 60.

The power supply circuit section 20 is composed of a power supply 21 and an impedance circuit section 22. The transistor 10 is composed of a drain 11, a gate 12 and a source 13. The output power processing circuit section 30 is composed of an output harmonic processing circuit section 31 and an output matching circuit section 32.

It should be noted that in an example of FIG. 2, GaN (gallium nitride) HEMT (High Electron Mobility Transistor) is used as the transistor 10. However, the present invention is not limited to this example. For instance, a bipolar transistor and a MOS (Metal Oxide Semiconductor) FET (Field Effect Transistor) and so on may be used as the transistor 10. In this case, the peripheral circuit is changed suitably according to need.

The connection relation of the components of the high efficiency power amplifier shown in FIG. 2 will be described. The input section 50 is connected with the gate 12 of the transistor 10. One of the ends of the power supply 21 is grounded. The other end of the power supply 21 is connected with one of the ends of an impedance circuit section 22. The other end of the impedance circuit section 22 is connected in common with the drain 11 of the transistor 10 and an input section of the output harmonic processing circuit section 31. The source 13 of the transistor 10 is grounded. An output section of the output harmonic processing circuit section 31 is connected with an input section of the output matching circuit section 32. An output section of the output matching circuit section 32 is connected with the output section 60. It should be noted that in FIG. 2, the output matching circuit section 32 is grounded in this example but may not be grounded. Also, the output section 60 may be connected with an external load 40 as shown in FIG. 2.

The operation of the high efficiency power amplifier shown in FIG. 2 will be described. The transistor 10 receives an input power which has a base angular frequency $•_0$ from the gate 12. The transistor 10 amplifies the input power while receiving the supply of the power from power supply circuit section 20, and outputs the amplified output power from the drain 11. In FIG. 2, the current 2i flowing through the drain 11 shows a current $i_d(t)$ of the output power, and a voltage 2v between the drain 11 and the source 13 shows a voltage $v_{ds}(t)$ of the output power.

At this time, power components corresponding to harmonics having angular frequencies of integer multiples of a base angular frequency $•_0$ are generally included in the output power outputted from the transistor 10 in addition to a power component corresponding to the fundamental wave having a base angular frequency $•_0$. When these harmonic power components have been consumed in the amplifier, the efficiency of the amplifier has fallen.

Therefore, the output harmonic processing circuit section 31 in the present embodiment is connected as the rear stage of the transistor 10 and carries out the reactive power control to most of the harmonic power components of the output power. The output harmonic processing circuit section 31 contains first to third harmonic processing circuit sections in the example shown in FIG. 2. Here, the first harmonic processing circuit section carries out the reactive power control to the secondary harmonic power component having the angular frequency of $2•_0$ of twice of the base angular frequency $•_0$ in the output power. In the same way, the second harmonic processing circuit section carries out the reactive power control to the third harmonic power component having the angular frequency of $3•_0$ of three times of the base angular frequency $•_0$ in the output power. Moreover, the third harmonic processing circuit section carries out the reactive power control to the fourth harmonic power component having the angular frequency of $4•_0$ of 4 times of the base angular frequency $•_0$ in the output power. It should be noted that because the harmonic power components subjected to the reactive power control are not consumed in the high efficiency power amplifier but are finally outputted as the fundamental wave component, the reactive power control contributes to the improvement of the efficiency of the power amplification.

It should be noted that it is freely selectable that the harmonic processing circuit sections should carry out the reactive power control to any of the harmonic power components in the reactive power, and the above description does not limit the present invention. Because the amplitude of every harmonic power component depends greatly on the characteristics of the transistor 10, it is consequentially desirable to primarily select the harmonic power component having a large amplitude as the object of the reactive power control, naturally. Only even-order harmonics may be subjected to the reactive power control in an extreme example.

In the background art, in order to restrain the power consumption of the harmonic power components, the technique of using the class-F amplifier and the inverse class-F amplifier is known that the adjustment is carried out to make the voltage and the current alternately to a zero level for every harmonic. The present invention does not deny such a technique. However, in order to further restrain the harmonics, a technique to carry out the reactive power control by adjusting to orthogonalize the phases of the voltage and current for every harmonic in the whole or part of the harmonics. That is, of the harmonics selected as a control target, a part is subjected to the reactive power control by orthogonalizing the phases of the voltage and current and the other part is made subjected to zero level processing, e.g. by making power consumption in the transistor to a zero level by using the technique of the class-F amplifier and the inverse class-F amplifier. For example, the fourth harmonic and the subsequent harmonics are subjected to the reactive power control by orthogonalizing the phases of the voltage and current and the second or third harmonics are subjected to the zero level processing so as to zero the power consumption in the transistor by using the technique of the class-F amplifier and the inverse class-F amplifier. Alternately, odd-order (even-order) harmonics are subjected to the reactive power control by orthogonalizing the phases of the voltage and current, while the even-order (odd-order) harmonics are subjected to the zero level processing by using the technique of the class-F amplifier and the inverse class-F amplifier so as to zero the power consumption in the transistor. Alternately, all the harmonics selected as the control target may be subjected to the reactive power control by orthogonalizing the phases of the voltage and current.

The effect is obtained that the degrees of freedom in the design of the output harmonic processing circuit section 31 or the output power processing circuit section 30 is further improved, by mixing two kinds of techniques of the restraint of the power consumption of the harmonics. Especially, when a microstrip line is used for the zero level processing of the power consumption in the class-F amplification or the inverse class-F amplification, there is a case where it is required to collect a plurality of open stubs in a same connection point. In such a case, the arrangement causes the geometrical difficulty. Here, a position where the open stub should be connected is in a distance of quarter-wave from the output section (drain 11 in FIG. 3) of the transistor 10 by converting to the electric length of the desired fundamental wave power component. Strictly, this distance is slightly shorter than the quarter wave in consideration of a parasitic capacitance of the transistor 10. However, when using the microstrip line to orthogonalize the phases of the current and voltage, it is possible to distribute the plurality of open stubs to a plurality of connection points arranged at optional positions of a main line section 34 so that it is difficult for the geometrical difficulty of their arrangement to occur.

The output matching circuit section 32 carries out impedance matching with the rear stage with respect to the fundamental wave power component of the output power. Because the impedance matching is the same as that of the conventional art, further detailed description is omitted. However, the output matching circuit section 32 may be unified with the output harmonic processing circuit section 31 to configure the output power processing circuit section 30.

It is ideal that a phase difference between the current and the voltage is kept to ±90 degrees in all the harmonics by adjusting to orthogonalize the phases. In this case, the theoretical efficiency is 100%. However, the efficiency is actually sacrificed by a small portion so as to permit a slight error of the phase difference. The permission range depends on a ratio of the amplitude of the fundamental wave and the amplitude of each of the harmonics.

When the phase difference in the fundamental wave power component is zero, it is enough to increase the DC supply power. On the other hand, when the DC supply power is a given condition, it is sufficient to adjust the phase difference of the fundamental wave power component.

When the transistor 10 is considered by an equivalent circuit which contains an output equivalent current source, the impedance when viewing the load 40 from the output equivalent current source is conjugate matching in the fundamental wave by carrying out impedance matching to the fundamental wave power component of the output power. Also, the impedance when viewing the load 40 from the output equivalent current source is pure reactance in the harmonic by carrying out the reactive power control to the harmonic power component of the output power.

The power factor can be set so that the impedance, when viewing a rear stage of the output power processing circuit section from an output equivalent power source of the transistor, is a pure reactance for the harmonic component subjected to the reactive power control, and the fundamental wave component of the impedance corresponds to an effective power component equal to a direct current supply power.

Figure 3:
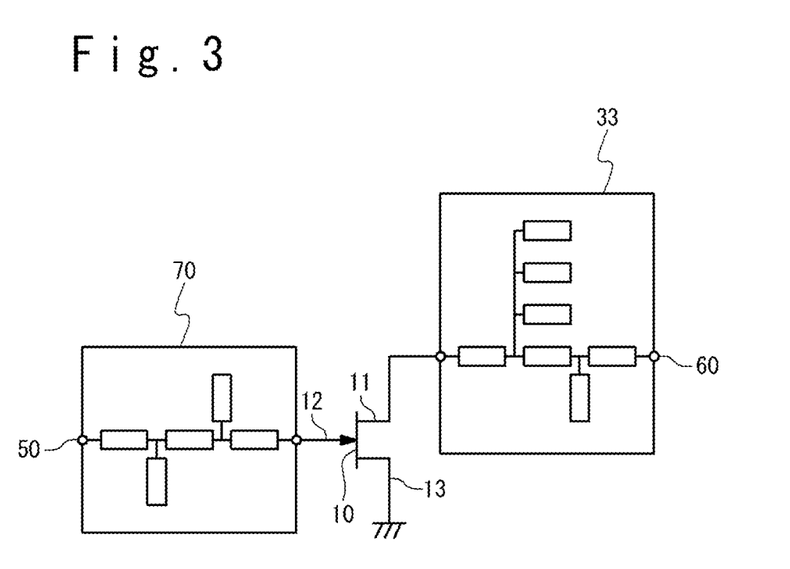
FIG. 3 is a circuit diagram showing the configuration of the high efficiency power amplifier according to an implementing example of the embodiment of the present invention.

FIG. 3 is a circuit diagram showing an implementing example of the high efficiency power amplifier according to the present embodiment of the present invention. In the high efficiency power amplifier of FIG. 3, two change points are applied to the high efficiency power amplifier according to the present embodiment of the present invention shown in FIG. 2. The first change point is in that the output power processing circuit section 30 according to the present embodiment of the present invention is embodied as an output power processing circuit section 33 which is configured by using a distributed constant circuit such as the microstrip line. The second change point is in that an input power processing circuit section 70 which is configured by using a distributed constant circuit such as the microstrip line is added between the gate 12 of the transistor 10 and the input section 50.

It should be noted that the power supply 21 and the external load 40 are omitted in FIG. 3 for simplification. The other configuration of the high efficiency power amplifier in the present embodiment is the same as that of the embodiment of the present invention shown in FIG. 2. Therefore, further detailed description is omitted.

Figure 4A:
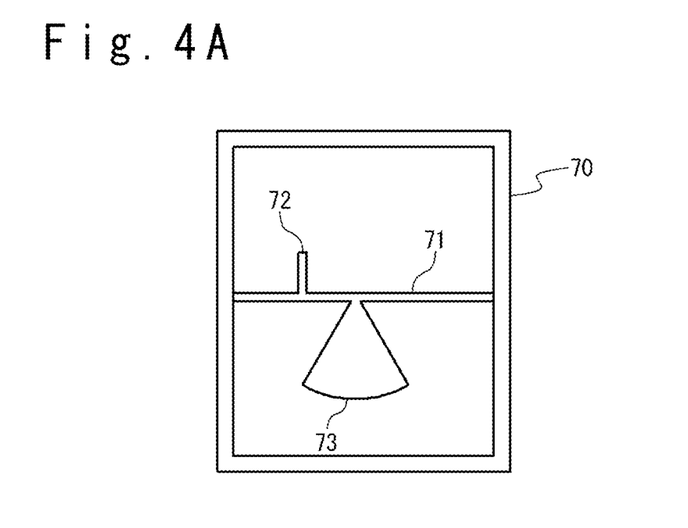
FIG. 4A is a plan view of an input power processing circuit section according to the embodiment of the present invention.

FIG. 4A is a plan view of the input power processing circuit section 70 in the implementing example of the present embodiment of the present invention. The input power processing circuit section 70 shown in FIG. 4A is composed of a main line section 71, an input fundamental wave matching circuit section 72 and an input harmonic processing circuit section 73. Here, the input fundamental wave matching circuit section 72 and the input harmonic processing circuit section 73 are open stubs.

The main line section 71 is connected with the input section 50 at one of the ends and connected with the gate 12 of the transistor 10 at the other end. The input fundamental wave matching circuit section 72 is connected with the main line section 71 at its one end. The input harmonic processing circuit section 73 is connected with the main line section 71 at its one end. Here, in the main line section 71, a connection section with the input section 50, a connection section with the input fundamental wave matching circuit section 72, a connection section with the input harmonic processing circuit section 73, and a connection section with the gate 12 of the transistor 10 are arranged in this order.

The input fundamental wave matching circuit section 72 carries out impedance matching to the fundamental wave power component having a desired base angular frequency $\omega_0$ of the input power supplied from the input section 50.

The input harmonic processing circuit section 73 carries out a phase adjustment to a feedback component to the input side of the transistor 10 through a feedback capacitance in the transistor 10, of the second harmonic power component for the voltage generated on the output side of the transistor 10. Here, the reason why the target is the second harmonic power component is in that the second harmonic power component has the largest amplitude among the harmonic power components excluding the fundamental wave power component so that the biggest effect is generally expected. Therefore, if a higher harmonic power component having the amplitude larger than the second harmonic power component exists, it is desirable that this higher harmonic power component is selected as the target of the phase adjustment instead of the second harmonic power component. In this way, the input harmonic processing circuit section 73 may handle the higher harmonic power component than the second harmonic power component, and also a plurality of the input harmonic processing circuit sections 73 may be provided to carry out the phase adjustment to a plurality of the higher harmonic power components. It should be noted that in an example of FIG. 4A, the input harmonic processing circuit section 73 has a fan shape, but this is merely an example, and does not limit the present invention.

Figure 4B:
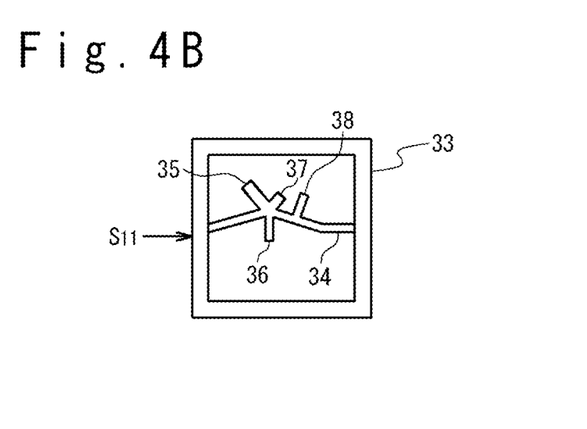
FIG. 4B is a plan view of an output power processing circuit section according to the embodiment of the present invention.

FIG. 4B is a plan view of the output power processing circuit section 33 in an implementing example of the present embodiment of the present invention. The output power processing circuit section 33 shown in FIG. 4B is composed of a main line section 34, a first output harmonic processing circuit section 35, a second output harmonic processing circuit section 36, a third output harmonic processing circuit section 37 and an output fundamental wave matching circuit section 38. Here, the first output harmonic processing circuit section 35, the second output harmonic processing circuit section 36, the third output harmonic processing circuit section 37 and the output fundamental wave matching circuit section 38 are open stubs, respectively.

The main line section 34 is connected with the drain 11 of the transistor 10 at one of the ends and is connected with the output section 60 at the other end. One end of each of the first output harmonic processing circuit section 35, the second output harmonic processing circuit section 36 and the third output harmonic processing circuit section 37 is connected with a common connection section of the main line section 34. The output fundamental wave matching circuit section 38 is connected with the main line section 34 at its one end. Here, in the main line section 34, a connection section with the drain 11 of the transistor 10, a common connection section with the first to third output harmonic processing circuit sections 35 to 37, a connection section with the output fundamental wave matching circuit section 38, and a connection section with the output section 60 are arranged in this order.

It should be noted that it is desirable that both portions of the plurality of output harmonic processing circuit sections 35 to 37 connected with the common connection section and the main line section 34 extending on both sides of the common connection section are connected equiangularly as much as possible to suppress a mutual influence.

The result when the input power processing circuit section 70 shown in FIG. 4A and the output power processing circuit section 33 shown in FIG. 4B are manufactured and their characteristics are measured will be described.

Figure 5:
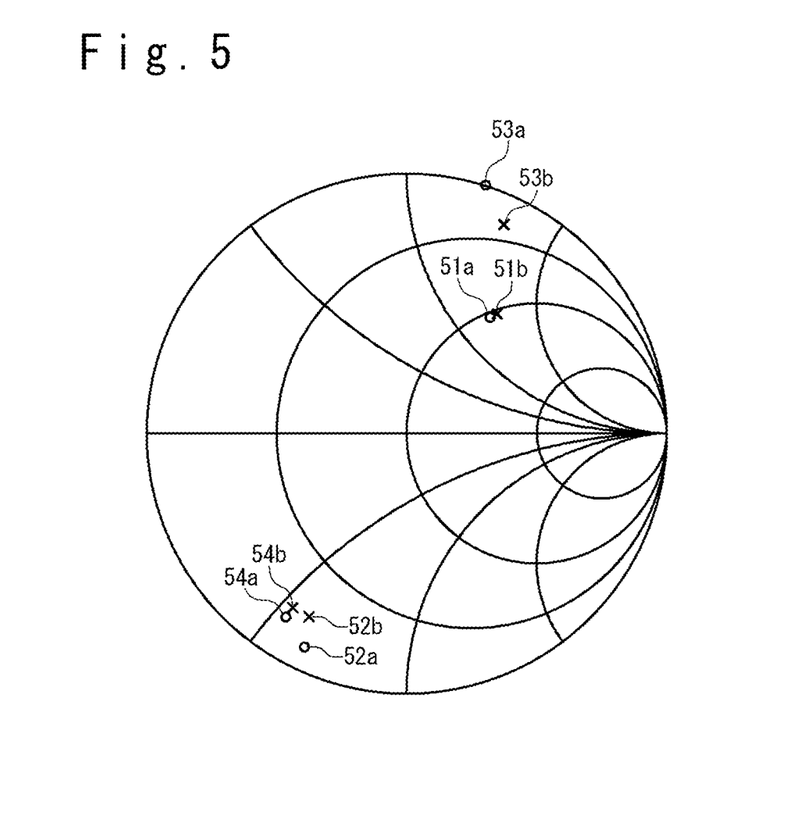
FIG. 5 is Smith chart showing a measurement result of characteristics of the high efficiency power amplifier according to the embodiment of the present invention.

FIG. 5 is a Smith chart showing the measurement result of the characteristics of the high efficiency power amplifier in an implementing example of the present embodiment of the present invention. Four points 51a, 52a, 53a, and 54a as theoretical values, and four points 51b, 52b, 53b and 54b as actual measurement values are shown in Smith chart of FIG. 5. The point 51a shows the theoretical value of the fundamental wave power component. The point 52a shows the theoretical value of the second harmonic power component. The point 53a shows the theoretical value of the third harmonic power component. The point 54a shows the theoretical value of the fourth harmonic power component. The point 51b shows the measurement value of the fundamental wave power component. The point 52b shows the measurement value of the second harmonic power component. The point 53b shows the measurement value of the third harmonic power component. The point 54b shows the measurement value of the four harmonic power component.

The voltage Vn, the current In, and the phase difference •n between voltage Vn and the current In can be read from each of these points 51b, 52b, 53b and 54b. Here, the n shows an integer of 1 to 4, "1" shows a fundamental wave power component, and "2" to "4" show the second to fourth harmonic power components. The measurement values of the voltage Vn, the current In and the phase difference •n for each of the fundamental wave power component and the second to fourth harmonic power components are shown in the following "Table 1". It should be noted that the fifth harmonic power component which is not shown in Smith chart of FIG. 5 is also shown in the following "Table 1".

TABLE 1

|  | ω0 | 2ω0 | 3ω0 | 4ω0 | 5ω0 |
| --- | --- | --- | --- | --- | --- |
| Vn (V) | 18.7 | 1.56 | 2.2 | 0.57 | 0.57 |
| In (mA) | 400 | 50 | 80 | 20 | 8 |
| θ n (degree) | 120.4 | −91.3 | 86.7 | −99 | 176.9 |

As could be seen from the "Table 1", it is confirmed that the absolute value of the phase difference between the voltage and the current is within a range of 86.7° to 99°, namely, the voltage and the current are almost orthogonal to each other, in the second to fourth harmonic power components subjected to the reactive power control of the output power. In other words, if the absolute value of the phase difference between the voltage and the current is 90°, the power factor becomes zero so that the reactive power control is fully carried out. The second to fourth harmonic power components are near in this state. However, the fifth harmonic power component is outside of the target of the reactive power control, and is not limited to this. That is, if the absolute value of the phase difference between the voltage and the current is zero or 180°, the power factor become 100% so as to carry out the control to the effective power fully, and the fifth harmonic power component is near this state. Also, the desired fundamental wave power component has the absolute value of the phase difference of 120.4° between the voltage and the current, and is confirmed that the fundamental wave power component is subjected to the reactive power control. This phase difference shows a state in which the effective power and the reactive power are mixed, and realistically it is possible to say that there is a sufficient effect.

Figure 6:
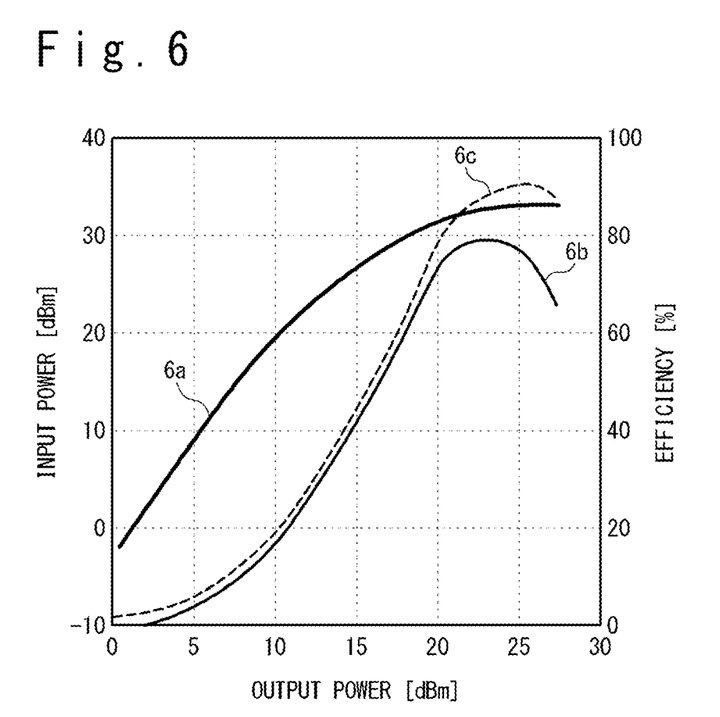
FIG. 6 is a graph group showing the measurement result of power efficiency at a 5.7-Ghz band of the high efficiency power amplifier according to the embodiment of the present invention.

FIG. 6 is a graph group showing the measurement results of power efficiency at a 5.7-Ghz band of the high efficiency power amplifier according to an implementing example of the present embodiment of the present invention. The graph group of FIG. 6 contains first to third graphs 6a to 6c. The first graph 6a shows the output power $P_{out}$ to the input power $P_{in}$ in decibel (dBm). The second graph 6b shows the power added efficiency PAE to the input power $P_{in}$ in percent (%). The third graph 6c shows the drain efficiency •$_0$ to the input power $P_{in}$ in percent (%).

In the measurement result of FIG. 6, the drain efficiency of 90.7% and the power added efficiency PAE of 79.5% are obtained in the 5.7-GHz band. This result is compared with a case of the power amplifier in the conventional technique. The following "Table 2" shows the measurement result of the high efficiency power amplifier according to the implementing example of the present embodiment of the present invention and the measurement result of the power amplifier in the first to fifth conventional techniques.

TABLE 2

| CONVENTIONAL ART | FREQUENCY (GHz) | PAE (%) | ηD (%) | SATURATION POWER (dBm) | TRANSISTOR |
|---|---|---|---|---|---|
| 1 | 4 | 73 | — | 31 | AlGaN/AlN/GaN HEMT |
| 2 | 5.3 | 52.5 | 64.1 | 20.5 | SiGe Bi CMOS |
| 3 | 5.5 | 45 | 63 | 34 | GaN HEMT |
| 4 | 5.8 | 70.5 | — | 38 | GaN HEMT |
| 5 | 5.86 | 71.4 | 79.9 | 33.4 | AlGaN/GaN HEMT |
| PRESENT INVENTION | 5.65 | 79.5 | 90.7 | 33.3 | AlGaN/GaN HEMT |

In the above-mentioned "Table 2", the first conventional technique is "A C-band high efficiency second-harmonic-tuned hybrid power amplifier in GaN technology", (IEEE Trans. Microw. Theory Tech., vol. 54, No. 6, pp. 2713-2722, June 2006) by P. Colantonio, F. Gianni, R. Giofre, E. Limiti, A. Serino, M. Peroni, P. Romanini, and C. Proietti. The second conventional technique is "High-Performance Microwave Gate-Recessed AlGaN/AlN/GaN MOS-HEMT With 73% Power-Added Efficiency" (IEEE Electron Device Lett., vol. 32, No. 5, pp. 626-628, May 2011) by Y. Hao, L. Yang, X. Ma, J. Ma, M. Cao, C. Pan, C. Wang, and J. Zhang. The third conventional technique is "BiCMOS MMIC class-E power amplifier for 5 to 6 GHz wireless communication systems" (Proc. 35th Eur. Microw. Conf., Paris, France, October 2005, pp. 445-448) by R. Negra, and W. Bachtold. The fourth conventional technique is "Internally-matched GaN HEMT high efficient power amplifier for SPS" (IEEE MTT-S Int. Microw. Works. Dig., Kyoto, Japan, May 2011, pp. 41-44) by Y. Tsuyama, K. Yamanaka, K. Namura, S. Chaki, and N. Shinohara. The fifth conventional technique is "Parasitic compensation design technique for a C-band GaN HEMT class-F amplifier" (IEEE Trans. Microw. Theory Tech., vol. 58, No. 11, pp. 2741-2750, November 2010) by K. Kuroda, R. Ishikawa, and K. Honjo.

As could be seen from the "Table 2", the significant improvement of 10% or more in the drain efficiency is actually realized in the high efficiency power amplifier according to the implementing example of the present embodiment of the present invention, compared with the maximum value of 79.9% (of the fifth conventional technique) in the conventional techniques.

The high efficiency power amplifier according to another implementing example of the present embodiment of the present invention is achieved by applying the following variation to the high efficiency power amplifier in the present embodiment of the present invention shown in FIG. 2. That is, the output power processing circuit section is formed by using a lumped constant circuit such as a capacitance and an inductance. Because the other configuration and operation of the high efficiency power amplifier in the present embodiment are the same as those of the embodiment of the present invention shown in FIG. 2, further detailed description is omitted.

By applying the above variation, the high efficiency power amplifier in the present embodiment becomes easy to use for a power transmission apparatus in the non-contact-type charging system of an electric vehicle which uses a megahertz band.

The above-mentioned embodiments and implementing examples of the present invention may be freely combined with each other in a range in which there is no technical contradiction. For example, in the high efficiency power amplifier according to the implementing example of the embodiment shown in FIG. 3, the input power processing circuit section and the output power processing circuit section may be formed by using the lumped constant circuits which have been described in the other implementing example of the embodiment.

The invention claimed is:

1. A high efficiency power amplifier comprising:
a transistor configured to amplify an input power which contains a fundamental wave power component having a base angular frequency in current and voltage, and output an output power and
an output power processing circuit section connected as a rear stage of the transistor
wherein the output power processing circuit section comprises:
an output matching circuit section configured to carry out impedance matching to the fundamental wave power component of the output power; and
an output harmonic processing circuit section configured to carry out a reactive power control as a control to a reactive power of a plurality of harmonic power components respectively having a plurality of harmonic angular frequencies which are integral multiples of the base angular frequency of the output power, and
wherein the output harmonic processing circuit section is configured to realize the reactive power control to at least one of the plurality of harmonic power components by orthogonalizing the phases of the current and voltage in the output power,
wherein the output harmonic processing circuit section comprises:
a phase adjusting circuit section configured to realize the reactive power control to said at least one harmonic power component by forming a short-circuit to said at least one harmonic power component.

2. A high efficiency power amplifier comprising:
a transistor configured to amplify an input power which contains a fundamental wave power component having a base angular frequency in current and voltage, and output an output power; and
an output power processing circuit section connected as a rear stage of the transistor,- wherein the output power processing circuit section comprises:
an output matching circuit section configured to carry out impedance matching to the fundamental wave power component of the output power; and
an output harmonic processing circuit section configured to carry out a reactive power control as a control to a reactive power of a plurality of harmonic power components respectively having a plurality of harmonic angular frequencies which are integral multiples of the base angular frequency of the output power, and
wherein the output harmonic processing circuit section is configured to realize the reactive power control to at least one of the plurality of harmonic power components by orthogonalizing the phases of the current and voltage in the output power,
wherein the output harmonic processing circuit section comprises:
a phase adjusting circuit section configured to realize the reactive power control to said at least one harmonic power component by forming a short-circuit to said at least one harmonic power component, and
wherein a power factor is set so that:
an impedance, when viewing a rear stage of said output power processing circuit section from an output equivalent power source of the said transistor, is a pure reactance for said harmonic component subjected to the reactive power control; and
said fundamental wave power component corresponds to an effective power component equal to a direct current supply power.

3. The high efficiency power amplifier according to claim 2, wherein the output harmonic processing circuit section further comprises:
another phase adjusting circuit section configured to realize the reactive power control to another of the plurality of harmonic power components by forming a short-circuit to said another harmonic power component,
wherein the output power processing circuit section further comprises:
a main line section connected between an output section of the transistor and a load at a rear stage of the transistor, and
wherein said phase adjusting circuit and said another phase adjusting circuit are connected with a plurality of connection points of the main line section, respectively.

4. The high efficiency power amplifier according to claim 2, wherein an impedance when viewing a rear stage side of the output power processing circuit section from an output equivalent current source of the transistor is conjugate-matched to the fundamental wave power component and is a pure reactance for said at least one harmonic power component subjected to the reactive power control.

5. The high efficiency power amplifier according to claim 2, wherein the plurality of harmonic power components subjected to the reactive power control comprises:

a second harmonic power component having an angular frequency of two times of the base angular frequency;
a third harmonic power component having an angular frequency of three times of the base angular frequency; and
a fourth harmonic power component having angular frequency of 4 times of the base angular frequency.

6. The high efficiency power amplifier according to claim 2, wherein the output harmonic processing circuit section comprises:
an open stub connected in a position of a quarter wave from an output section of the transistor when the fundamental wave power component is converted into a substantial electric length, and formed to set to a zero level, an amplitude of one of the voltage and the current in said at least one of the plurality of harmonic power components.

7. The high efficiency power amplifier according to claim 2, further comprising:
an input power processing circuit section connected with a front-stage of the transistor,
wherein the input power processing circuit section comprises:
an input matching circuit section configured to carry out impedance matching of a fundamental wave power; and
an input harmonic processing circuit section configured to carry out the reactive power control to said at least one of a plurality of harmonic powers.

8. The high efficiency power amplifier according to claim 2, wherein the transistor comprises a GaN (gallium nitride) HEMT (high electron mobility transistor).

9. The high efficiency power amplifier according to claim 2, wherein the output harmonic processing circuit section comprises a lumped constant circuit section configured to carry out the reactive power control to said at least one of the plurality of harmonic powers.

10. The output harmonic processing circuit section according to claim 2.

11. The high efficiency power amplifier according to claim 2, wherein the output harmonic processing circuit section comprises:
a distributed constant circuit section configured to carry out the reactive power control to said at least one harmonic.

12. The high efficiency power amplifier according to claim 11, wherein the distributed constant circuit section comprises an open stub which has an electric length of ¼ wavelength of said at least one harmonic power component subjected to the reactive power control.

13. The high efficiency power amplifier according to claim 11, wherein the distributed constant circuit section comprises a plurality of open stubs, each of which has an electric length of ¼ wavelength of one of the plurality of harmonic power components subjected to the reactive power control, and
wherein one end of each of the plurality of open stubs is connected with a common connection point of the output harmonic processing circuit section.

* * * * *